United States Patent
Daanen (10) Patent No.: US 10,431,317 B2
(45) Date of Patent: Oct. 1, 2019

(54) MEMORY SYSTEM

(71) Applicant: NXP B.V., Eindhoven (NL)

(72) Inventor: Antonius Martinus Jacobus Daanen, Beuningen (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/909,010

(22) Filed: Mar. 1, 2018

(65) Prior Publication Data

US 2019/0074071 A1    Mar. 7, 2019

(30) Foreign Application Priority Data

Mar. 31, 2017 (EP) .................................. 17164413

(51) Int. Cl.
| | | |
|---|---|---|
| G11C 17/16 | (2006.01) | |
| G11C 17/18 | (2006.01) | |
| G11C 17/14 | (2006.01) | |
| H01L 27/102 | (2006.01) | |
| H01L 27/112 | (2006.01) | |

(52) U.S. Cl.
CPC .......... *G11C 17/165* (2013.01); *G11C 17/146* (2013.01); *G11C 17/16* (2013.01); *G11C 17/18* (2013.01); *H01L 27/1026* (2013.01); *H01L 27/11206* (2013.01)

(58) Field of Classification Search
CPC ....... G11C 17/146; G11C 17/18; G11C 17/16; H01L 27/1026; H01L 27/11206
See application file for complete search history.

(56) References Cited

U.S. PATENT DOCUMENTS

| 4,719,042 A | 1/1988 | Schaper et al. |
| 5,150,325 A | 9/1992 | Yanagisawa et al. |
| 5,467,027 A * | 11/1995 | Burton .................... G11C 17/16 326/38 |
| 6,693,481 B1 | 2/2004 | Zheng |
| 7,304,527 B1 | 12/2007 | Guzman |
| 7,715,219 B2 * | 5/2010 | Monreal ................. G11C 17/16 365/225.7 |
| 8,223,530 B2 * | 7/2012 | Kitagawa ........... G11C 13/0009 365/148 |
| 8,362,482 B2 * | 1/2013 | Or-Bach ............. H01L 21/6835 257/48 |
| 2009/0323450 A1 * | 12/2009 | Monreal ................. G11C 17/16 365/225.7 |
| 2010/0128511 A1 * | 5/2010 | Worley ................... G11C 17/16 365/96 |
| 2010/0271861 A1 * | 10/2010 | Kitagawa ........... G11C 13/0009 365/148 |

(Continued)

FOREIGN PATENT DOCUMENTS

WO    WO-02/43152 A2    5/2002

*Primary Examiner* — Xiaochun L Chen (57) ABSTRACT

A memory system comprising: a memory cell. The memory cell comprising a poly-fuse-resistor; and a bipolar junction transistor having a collector-emitter channel and a base-terminal. The collector-emitter channel of the bipolar junction transistor is connected in series with the poly-fuse resistor between a supply-voltage-terminal and a ground-terminal. The base-terminal of the bipolar junction transistor is configured to receive a transistor-control-signal to selectively control a current flow through the poly-fuse-resistor.

13 Claims, 2 Drawing Sheets

(56) References Cited

U.S. PATENT DOCUMENTS

| | | | |
|---|---|---|---|
| 2011/0121366 A1* | 5/2011 | Or-Bach | H01L 21/6835 257/204 |
| 2014/0022430 A1* | 1/2014 | Ueno | H04N 5/37455 348/308 |
| 2014/0244930 A1* | 8/2014 | Lee | G11C 11/1673 711/118 |
| 2015/0279449 A1* | 10/2015 | Moriwaki | G11C 5/02 365/51 |

* cited by examiner

MEMORY SYSTEM

CROSS-REFERENCE TO RELATED APPLICATIONS

This application claims the priority under 35 U.S.C. § 119 of European patent application no. 17164413.1, filed Mar. 31, 2017 the contents of which are incorporated by reference herein.

The present disclosure relates to memory systems, and in particular, although not exclusively, non-volatile memory systems that are one time programmable (OTP)

According to a first aspect of the present disclosure there is provided a memory system comprising:
 a memory cell comprising:
  a poly-fuse-resistor; and
  a bipolar junction transistor having a collector-emitter channel and a base-terminal;
 wherein the collector-emitter channel of the bipolar junction transistor is connected in series with the poly-fuse resistor between a supply-voltage-terminal and a ground-terminal; and
 the base-terminal of the bipolar junction transistor is configured to receive a transistor-control-signal to selectively control a current flow through the poly-fuse-resistor.

In one or more embodiments, the bipolar junction transistor is configured to selectively control a writing-current flow through the poly-fuse-resistor. The writing-current may be large enough to change the state of the poly-fuse-resistor from an initial-resistance-state to an altered-resistance-state.

In one or more embodiments, the poly-fuse-resistor and the bipolar junction transistor are provided as part of the same integrated circuit. The poly-fuse-resistor and the bipolar junction transistor may be provided on the same substrate.

In one or more embodiments, the memory system further comprises a sense circuit comprising a voltage-comparator with a comparator-input-terminal, a comparator-reference-terminal and a read-out-terminal. The comparator-input-terminal may be coupled to a cell-node of the memory cell, such that a voltage at said cell-node is indicative of a voltage dropped across the poly-fuse-resistor. The comparator-reference-terminal may be connectable to a reference voltage. The read-out-terminal may be configured to provide a read-out-signal in response to a difference between a voltage at the comparator-input-terminal and a voltage at the comparator-reference-terminal such that said read-out-signal is representative of a resistance-state of the poly-fuse resistor.

In one or more embodiments, the voltage-comparator comprises a differential pair of bipolar transistors.

In one or more embodiments, the voltage-comparator, the poly-fuse-resistor and the bipolar junction transistor are provided on the same substrate.

In one or more embodiments, the memory system further comprises a common-reference-cell comprising: a reference-supply-terminal connected to the supply-voltage-terminal of the memory cell; a reference-cell-ground-terminal connected to the ground-terminal of the memory cell; a plurality of reference-poly-fuse-resistors connected in series with each other between the reference-supply-terminal and the reference-cell-ground-terminal; and a reference-voltage-terminal connected to the comparator-reference-terminal of the voltage-comparator and configured to provide a voltage representative of the voltage dropped across the plurality of reference-poly-fuse-resistors.

In one or more embodiments, the memory system further comprises a logic gate for providing the transistor-control-signal. The logic gate may be a NOR gate.

In one or more embodiments, the logic gate comprises: a transistor, having a conduction-channel and a control-terminal; an input-terminal connected to the control-terminal of the transistor; a limiting-resistor; and an output-terminal for providing the transistor-control-signal. The conduction-channel of the transistor and the limiting-resistor may be connected in series between a logic-gate-supply-terminal and the output-terminal.

In one or more embodiments, the memory system further comprises read circuitry, wherein the read circuitry comprises: a cell-current-terminal that is connectable to a current source, to conduct a read current during a read-mode; a cell-probe-terminal for providing a signal that is indicative of a voltage dropped across the poly-fuse-resistor; a first-read-switch connected between: (i) the poly-fuse-resistor, and (ii) the cell-probe-terminal, in order to selectively connect the poly-fuse-resistor to the cell-probe-terminal in accordance with a read-input-signal; and a second-read-switch connected between: (i) the poly-fuse-resistor, and (ii) the cell-current-terminal, in order to selectively connect the poly-fuse-resistor to the cell-current-terminal in accordance with a read-input-signal.

In one or more embodiments, the memory system is implemented on a BICMOS platform. The BICMOS platform may have a feature size that is less than 0.5 um.

There may be provided an integrated circuit comprising any memory system disclosed herein.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The figures and Detailed Description that follow also exemplify various example embodiments. Various example embodiments may be more completely understood in consideration of the following Detailed Description in connection with the accompanying Drawings.

BRIEF DESCRIPTION OF DRAWINGS

One or more embodiments will now be described by way of example only with reference to the accompanying drawings in which.

In electronic circuits, in IC implementation there is a need for storage of data. Examples of usage of such mechanism are for example, but not limited to the storage of a device ID, storage of manufacturing data like batch numbers or device specific test results with the intention to tune circuit performance to an optimum. Also it can enable changing product characteristics after production, by modifying certain controlling characteristics during product test.

The data can be determined and stored once and can be used multiple times thereafter. The data shall be available even after the electronic circuit has been without active supply power for longer periods of time. Such a data storage functionality is known as a non-volatile memory (NVM). NVM is typically manufactured using MOS based platforms.

Figure 1:
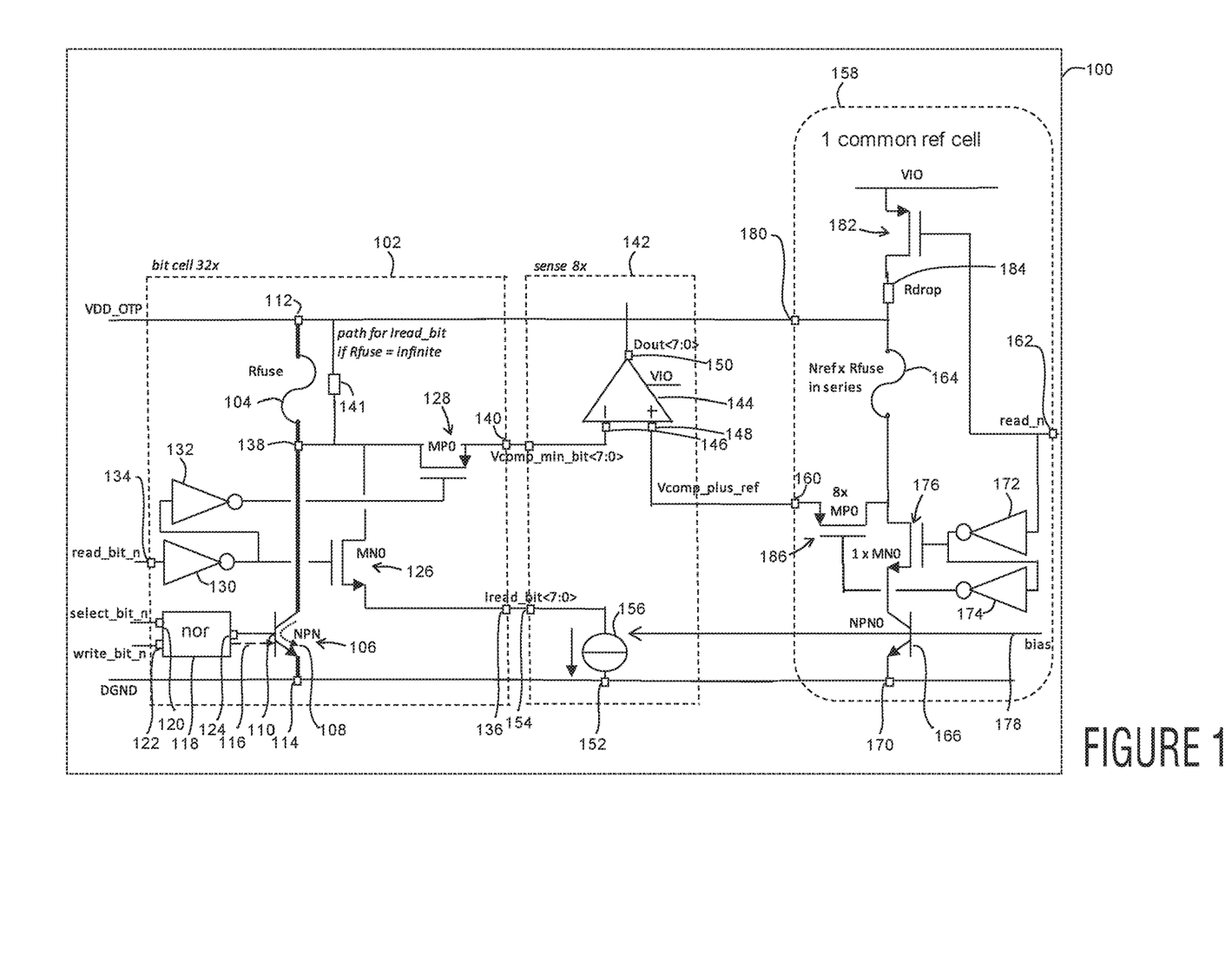
FIG. 1 shows an example embodiment of a memory system.

FIG. 1 shows an example embodiment of a memory system 100 comprising a memory cell 102. The memory cell 102 comprises a poly-fuse-resistor 104 and a bipolar junction transistor (BJT) 106 with a collector-emitter channel 108 and a base-terminal 110. The BJT 106 in this example is a NPN transistor. The collector-emitter channel 108 of the BJT 106 is connected in series with the poly-fuse-resistor 104 between a supply-voltage-terminal 112 and a ground-terminal 114. In this example embodiment, the poly-fuse-resistor 104 is connected to the supply-voltage-terminal 112 and the BJT 106 is connected to the ground-terminal 114. However, the skilled person will appreciate that the reverse situation can be realised without loss of functionality. It will also be appreciated that other components could be coupled together with the poly-fuse-resistor 104 and the BJT 106, between the supply-voltage-terminal 112 and the ground terminal 114, without loss of functionality. The base-terminal 110 of the BJT 106 is configured to receive a transistor-control-signal 116.

The poly-fuse-resistor 104 may include a piece of polysilicon material. The poly-fuse-resistor 104 may be characterised by certain dimensions, such as layer thickness, line-width and line-length. Across the line-length, two terminals may be defined forming a resistor between them. While the layer thickness typically is a pre-defined value in a given IC manufacturing process, the line-width and line-length may be chosen such that a specific initial-resistance Ri results between the two terminals of the poly-fuse-resistor 104.

When a certain voltage Vwrite is applied across the length of the poly-fuse-resistor, the resistive nature of the polysilicon material causes a writing-current to flow. The magnitude and duration of the writing-current is such that the resistive polysilicon material heats up to a temperature sufficient to create a void in the polysilicon material. The void changes the effective resistance of the poly-fuse-resistor 104 from the initial resistance value Ri to a much higher value; for example, Rp=A*Ri, where A is subject to statistical spread. The statistics may be such that with sufficient certainty A will be larger than Amin, where Amin>>1. Practical values of Amin are in the range of 10 or higher and depend on various parameters including the dimensions of the poly-fuse-resistor 104 and the magnitude and duration of the applied voltage, Vwrite.

The poly-fuse-resistor 104 can thus be in one of two states: (i) an initial-resistance-state, comprising a resistance value Ri; or (ii) an altered-resistance-state, comprising an altered resistance A*Ri, where A>Amin. These two states may represent one bit of information. The described process of altering the resistance of the poly-fuse-resistor 104 from initial resistance Ri to altered resistance A*Ri, A>Amin by applying a write-voltage Vwrite will be referred to as writing (or programming) the memory bit of the memory cell 102 from a logical value of 0 to a logical value of 1. The current applied during writing will be referred to as a writing-current.

The chosen physical size of the poly-fuse-resistor 104 is such that with a modest supply voltage of only a few volts, a large writing-current in the order of tens of mA is needed to produce enough heat in the poly-fuse-resistor 104 for writing a logical value of 1.

The changed properties, including the increased resistance, of the poly-fuse-resistor 104 may remain in that state as long as the polysilicon material is not again subjected to a high temperature similar to the temperature that was present during the writing of the bit. Under this condition the poly-fuse-resistor 104 is said to be One Time Programmable (OTP). The state can remain unchanged, even when no supply voltage is present in the memory system 100.

In the example embodiment of FIG. 1, the BJT 106 can selectively control the flow of a writing-current through the poly-fuse-resistor 104, wherein the writing-current is large enough to change the state of the poly-fuse-resistor 104 from the initial-resistance-state to the altered-resistance-state, to enable and disable a write-mode of the memory cell 102.

To enable the write-mode of the memory cell 102, the transistor-control-signal 116 applies a sufficient base current to the base-terminal 110 of the BJT 106 to switch on the BJT 106. For example a base current that is high enough such that the BJT 106 enters the saturation region, where a large current can flow through the collector-emitter channel 108 of the BJT 106, and the collector-emitter voltage equals the saturation voltage Vce(sat). The saturation voltage value depends on the BJT 106 device process parameters and may be in the order of one tenth of a Volt. Thus, during the write-mode, a relatively high voltage is provided across the terminals of the poly-fuse-resistor 104 (due to the relatively low voltage drop across the BJT 106) with a high writing-current flowing. In this way, when the BJT 106 is switched on, a high voltage (Vwrite) is dropped across the poly-fuse-resistor 104, causing a current to flow through the collector-emitter channel 108 that has a magnitude that is sufficient for it to be considered a writing current for the poly-fuse-resistor 104.

To disable the write-mode, the transistor-control-signal 116 applied to the base-terminal 110 of the BJT 106 is such that the BJT 106 is switched off. For example, the BJT 106 does not enter the saturation region and either zero current or a negligible current flows through the BJT 106, for instance a current at least an order, or a few orders, of magnitude less than the writing-current that flows when the BJT 106 is on.

The BJT 106 device size may be chosen to be just large enough to handle the writing-current density required for writing the poly-fuse-resistor 104, without destroying the BJT 106 itself during the short writing time. For a similar low drain source voltage at the required writing-current, a NMOS transistor would need to be much larger in area than the BJT 106 device. In one particular embodiment of 32 bits and limited supply voltage during writing, the estimated area increase when using MOS is in the order of 50%. This number is even more dramatic if a higher writing supply voltage is used, in which case the BJT 106 may be a factor of 2 to 4 smaller. Therefore, advantageously, using a BJT 106 instead of a NMOS transistor can enable the memory system 100 to occupy less area of an IC on which it is implemented.

A skilled person may expect to use MOS transistors in circuits with poly-fuse resistors. However, due to the relatively large size of MOS transistors that are required to switch the high writing-current necessary for poly-fuse-resistors, the skilled person may instead use different forms of OTP memory. This is because the use of MOS transistors to switch the high writing-current required for poly-fuse-resistors results in large and expensive memory systems. Surprisingly, the use of a BJT 106 as described herein, can enable the use of poly-fuse-resistors 104 in relatively low cost and compact OTP memory systems.

When the write-mode is enabled, a write-supply-voltage is provided at the supply-voltage-terminal 112 of the memory cell 102, such that a write voltage Vwrite is present across the terminals of the poly-fuse-resistor 104. In this example, the write-supply-voltage is provided by an external voltage source (not shown, although it would be connected to VDD_OTP) which can be selectively connected to the supply-voltage-terminal 112. The write-mode is enabled when both: (i) the external voltage source is connected, such that Vwrite is present across the terminals of the poly-fuse-resistor 104, and (ii) the BJT 106 is switched on via the transistor-control-signal 116; otherwise the write-mode is disabled. A contact pin or pins may be provided to enable connection of the external voltage source to the supply-voltage-terminal 112. An example write-supply-voltage is 2.5 V. In other embodiments, the write-supply-voltage may be equal to or derived from a system-supply-voltage VIO.

The transistor-control-signal 116 may be provided by a logic gate 118. In the example embodiment of FIG. 1, the logic gate 118 is a NOR gate with a select-input terminal 120 and a write-input terminal 122. The output terminal of the NOR gate is a transistor-control-terminal 124 which is connected to the base-terminal 110 of the BJT 106. The select-input terminal 120 is configured to receive a select-bit-signal (select_bit_n) representative of whether the memory cell 102 is selected (from a plurality of memory cells) for addressing. The write-input terminal 122 is configured to receive a write-bit-signal (write_bit_n), representative of whether the memory cell 102 is to be written to a logic value of 1. In this example, the select-bit-signal (select_bit_n) should be set as logic 0 if the memory cell 102 is to be addressed and logic 1 if it is not. Similarly, the write-bit-signal (write_bit_n) should be set as logic 0 if the memory cell 102 is to be written to a logic 1, and set as logic 1 if the memory cell 102 is not to be written to a logic 1. The NOR gate may be powered by the system-supply-voltage VIO.

When the NOR gate receives a logic low signal for both the select-bit-signal (select_bit_n) and the write-bit-signal (write_bit_n), the transistor-control-terminal 124 of the NOR gate provides a logic high transistor-control-signal 116 to the base-terminal 110 of the BJT 106. This will apply a base current to the BJT 106, such that the BJT 106 may enter the saturation region, and the write-mode is enabled. A writing-current can then flow from the supply-voltage-terminal 112 through the poly-fuse-resistor 104 and the collector-emitter-channel 108 of the BJT 106 to the ground-terminal 114. The writing-current will increase the resistance and change the state of the poly-fuse-resistor 104, from the initial-resistance-state to the altered-resistance state. The memory bit of the memory cell 102 is thereby written to a logical value of 1.

When the NOR gate receives a logic high for either or both of the select-bit-signal (select_bit_n) and the write-bit-signal (write_bit_n), the transistor-control-terminal 124 of the NOR gate provides a logic low transistor-control-signal 116 to the base-terminal 110 of the BJT 106. The BJT 106 will be off, the writing-current will not flow through the BJT 106 or the poly-fuse-resistor 104, and the write-mode of the memory cell 102 will not be enabled. The state of the memory bit of the memory cell 102 will therefore not be altered.

The transistor-control-signal provides a high base current to switch on the BJT 106 to enable the write-mode. As will be discussed with reference to FIG. 2, the logic gate 118 may have a sufficiently low impedance such that it can provide a base current to the base-terminal 110 of the BJT 106 capable of switching on the BJT 106 and enabling the write-mode.

Figure 2:
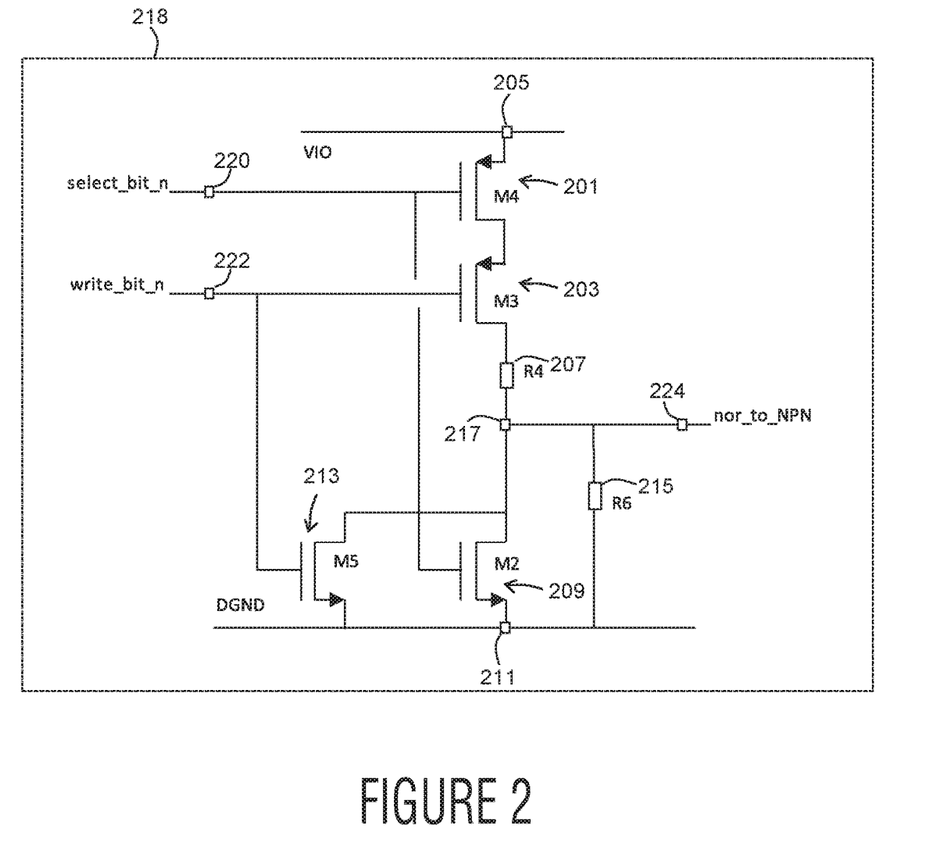
FIG. 2 is an example illustration of a NOR gate capable of switching on the BJT of FIG. 1.

FIG. 2 is an example illustration of a NOR gate 218 capable of switching on the BJT of FIG. 1. The NOR gate includes the select-input-terminal 220 and the write-input-terminal 222 to receive the select-bit-signal (select_bit_n) and write-bit-signal (write_bit_n) as described in relation to the NOR gate of FIG. 1. The NOR gate also includes the transistor-control-terminal 224 as an output terminal for providing the transistor-control-signal of FIG. 1. Internal to the NOR gate, the conduction channels of a first-p-channel-transistor 201 and a second-p-channel-transistor 203 are connected in series between a NOR-supply-terminal 205 and a limiting-resistor 207. The conduction channel of a first-n-channel transistor 209 is connected between the limiting-resistor 207 and a NOR-ground-terminal 211. The conduction channel of a second-n-channel-transistor 213 is connected in parallel with the conduction channel of the first-n-channel-transistor 209. A protection-resistor 215 is also connected in parallel with the conduction channels of the two n-channel-transistors 209, 213. The output terminal of the NOR gate is the transistor-control-terminal 224 and is connected to a node 217 formed between the first n-channel-transistors 209 and the limiting-resistor 207. The select-input-terminal 220 is connected to a control terminal of the first-p-channel-transistor 201 and a control terminal of the first-n-channel-transistor 209. The write-input-terminal 222 is connected to a control terminal of the second-p-channel-transistor 203 and a control terminal of the second-n-channel-transistor 213. In this example the two p-channel-transistors 201, 203 and the two n-channel-transistors 209, 213 are field-effect-transistors (FETs), and therefore the control terminal is a gate terminal and the conduction channels are formed between a source and a drain of each transistor.

When a logic 0 is provided to both the select-input-terminal 220 and the write-input-terminal 222, the first-p-channel transistor 201 and second-p-channel transistor 203 will switch on providing a low impedance path between the NOR-supply-terminal 205 and the transistor-control-terminal 224. This enables a high current to be provided at the transistor-control-terminal 224, for example a current that is sufficiently high to switch on the BJT of the memory cell of FIG. 1. The dimensions of the two p-channel-resistors 201, 203 should be sufficiently large to be capable of conducting the high current. The limiting-resistor 207 can be chosen to limit the maximum current that may be provided at the transistor-control-terminal 224. It may be desirable to limit the base current provided to the base-terminal of the BJT of FIG. 1, particularly when the BJT is in deep saturation.

Specifically, the NOR gate 218 of FIG. 2, differs from standard NOR gates in that the p-channel-transistors 201 and 203 are sufficiently large to provide the base current to the BJT 106. At the same time, the current can be limited (to prevent unnecessary current consumption) by limiting the dimensions of the p-channel-transistors 201 and 203 and/or by providing the limiting-resistor 207. A degree of freedom is therefore provided in choosing the dimensions of the p-channel-transistors 201 and 203 and the resistance value of the limiting-resistor 207. This degree of freedom provides flexibility to set the base current limit of the BJT 106 according to specific requirements determined by process device parameter spread and environmental variables such as the available supply-voltage and operating temperature.

When a logic 1 is provided to either or both of the select-input-terminal 220 and the write-input-terminal 222, at least one of the first-p-channel-transistor 201 and the second-p-channel-transistor 203 will be switched off. A high impedance path will exist between the NOR-supply-terminal 205 and the transistor-control-terminal 224. At least one of the first-n-channel transistor 209 and second-n-channel transistor 213 will switch on providing a low impedance path between the transistor-control-terminal 224 and the NOR-ground-terminal 211. Zero or negligible current will therefore be provided at the transistor-control-terminal 224.

When the NOR gate 218 is implemented in the embodiment of FIG. 1, the NOR-ground-terminal 211 is connected to the ground-terminal of the memory cell and the transistor-control-terminal 224 is connected to the base-terminal of the BJT. The protective resistor 215 provides protection to the BJT, for example when a high voltage is present at the collector of the BJT. A voltage applied to the NOR-supply-terminal 205 may be derived from the system-supply-voltage VIO or may be provided by a separate voltage source.

More generally, the memory system can include a logic gate that comprises: (i) a transistor (such as the first-p-channel-transistor 201 or the second-p-channel-transistor 203), having a conduction-channel and a control-terminal; (ii) an input-terminal (such as the select-input-terminal 220 or the write-input-terminal 222) connected to the control-terminal of the transistor; (iii) a limiting-resistor 207; and (iv) an output-terminal 224 for providing the transistor-control-signal. Wherein the conduction channel of the transistor and the limiting-resistor are connected in series between a NOR-supply-terminal 205 and the output-terminal 224. In the example of FIG. 2, the logic gate has a first-transistor 201 and a second-transistor 203, wherein the first-control-terminal of the first-transistor 201 is connected to a first-input terminal 220, the second-control-terminal of the second-transistor 203 is connected to a second-input terminal 222, and the first-conduction-channel of the first-transistor, the second-conduction-channel of the second-transistor, and the limiting-resistor are connected in series between the NOR-supply-terminal 205 and the output-terminal 224.

Returning to FIG. 1, in this embodiment, the memory cell 102 further comprises read circuitry comprising switch circuitry, a read-input-terminal 134, a cell-probe-terminal 140 and a cell-current-terminal 136. The cell-current-terminal 136 is connectable to a current source 156, to conduct a read current (Iread) during the read-mode. The function of the read circuitry is to enable a read-mode by switching the read-current (Iread) through the poly-fuse-resistor 104 in response to a read-input-signal (read_bit_n) applied to the read-input-terminal 134. In this way, the resistance or state of the poly-fuse-resistor 104 (the state of the memory bit of the memory cell 102) can be read-out by measuring a read-voltage Vread at the cell-probe terminal 140. During the read-mode the write-mode is not enabled, that is the BJT 106 is off. Similarly, during the write-mode, the read-mode is not enabled.

The read-current (Iread) is much smaller than the write-current, and can be in the order of some tens of uA (micro Amperes). The read-current (Iread) should be sufficiently small in order not to alter the physical properties of the poly-fuse-resistor 104 due to resistive heating. That is, when a read-mode is active, the read-current (Iread) should not change the state of the poly-fuse resistor 104.

In this embodiment, the switch circuitry of the read circuitry comprises a read-n-channel-transistor 126, a read-p-channel-transistor 128, a first-inverter 130 and a second-inverter 132. The read-n-channel-transistor 126 and the read-p-channel-transistor are examples of a first-read-switch and a second-read-switch. A cell-node 138 is defined as a node between the poly-fuse-resistor 104 and the collector-emitter channel 108 of the BJT 106. The conduction channel of the read-n-channel-transistor 126 is connected between the cell-node 138 and the cell-current-terminal 136. The cell-current-terminal 136 is connectable to a current source 156. In this way, the read-n-channel-transistor 126 can selectively connect the poly-fuse-resistor 104 to the cell-current-terminal 136 in accordance with the read-input-signal (read_bit_n). The conduction channel of the read-p-channel-transistor 128 is connected between the cell-node 138 and the cell-probe-terminal 140 in order to selectively connect the poly-fuse-resistor 104 to the cell-probe-terminal 140 in accordance with the read-input-signal (read_bit_n).

The first-inverter 130 is connected between the read-input-terminal 134 and a control terminal of the read-n-channel-transistor 126. The second inverter 132 is connected between the first-inverter 130 and a control terminal of the read-p-channel-transistor 128. The first and second inverter ensure the correct polarity of control signal is applied to the control terminals of the read-n-channel-transistor 126 and the read-p-channel-transistor 128 in response to the read-input-signal (read_bit_n) received at the read-input-terminal 134

To enable the read mode of the memory system 100, a logic 0 is provided to the read-input-terminal 134, via the read-input-signal (read_bit_n), which acts to switch on (close) both the read-n-channel-transistor 126 and the read-p-channel transistor 128. The current source 156 is coupled to the cell-current-terminal 136 such that a small read-current (Iread) may flow through the poly-fuse-resistor 104 and the conduction channel of the read-n-channel-transistor 126. The read-current (Iread) is steered through the poly-fuse-resistor 104 of the memory cell 102. The poly-fuse-resistor 104 may have previously been written/programmed, that is it may be in either (i) the initial-resistive-state, representing a logic value of 0 or (ii) the altered resistive state representing a logic value of 1. In this example, a read-supply-voltage Vrs is derived from the system-supply-voltage VIO and applied to the supply-voltage-terminal 112 of the memory cell 102 to enable the current source to pull the read current (Iread) through the poly-fuse-resistor 104. In alternative embodiments, the read-supply-voltage Vrs may be provided by an external voltage source. The read-supply-voltage Vrs may be approximately 1.2 V. With the read-p-channel transistor 128 closed, the cell-probe-terminal 140 is coupled to the cell-node 138. The read-voltage Vread measured at the cell-probe-terminal 140 will therefore be representative of the voltage dropped across the poly-fuse-resistor 104. The voltage drop is equal to either (i) Iread*Ri when the poly-fuse-resistor 104 is in the initial-resistance-state, or (ii) Iread*A*Ri when the poly-fuse-resistor 104 is in the altered-resistance-state. Therefore Vread will be representative of the state of the poly-fuse-resistor 104. The state of the poly-fuse-resistor 104 (the state of the memory bit of the memory cell 102) can be read-out by measuring Vread at the cell-probe terminal 140.

In this embodiment, a cell-protection-resistor 141 is provided in parallel with the poly-fuse-resistor 104. This is to protect the memory cell 102 in the event that the resistance of the poly-fuse-resistor 104 in the altered-resistance-state is close to an open-circuit equivalent resistance (A is too high, and perhaps approaching infinity). In this case, the cell-protection-resistor 141 will prevent the voltage at the cell-node 138 falling close to 0 V. The resistance of the cell-protection-resistor may be of the order of 5 kohms.

In this embodiment, the memory system 100 also comprises a sense circuit 142 to measure the read-voltage Vread at the cell-probe-terminal 140 of the memory cell 102. The sense circuit 142 measures Vread at the cell-probe-terminal 140 by comparing it to a reference-voltage Vref (Vcomp_plus_ref in FIG. 1) and providing a read-out-signal Dout with a logical value representative of Vread, and therefore representative of the state of the poly-fuse-resistor 104.

The sense circuit 142 comprises a voltage-comparator 144 with: a comparator-input-terminal 146, connected to the cell-probe-terminal 140; a comparator-reference-terminal 148; and a read-out-terminal 150. The sense circuit 142 further comprises a sense-ground-terminal 152, and a sense-current-terminal 154 for connecting the current source 156 to the cell-current-terminal 136 of the memory cell 102.

The voltage-comparator 144 can compare the voltage at the comparator-input-terminal 146 with a voltage at the comparator-reference-terminal 148. When the read-mode is enabled, the voltage at the comparator-input-terminal 146, connected to the cell-probe-terminal 140, is the read-voltage Vread. The comparator-reference-terminal 148 can receive a reference-voltage Vref such that the read-out-signal Dout at the read-out-terminal 150 of the voltage-comparator 144 is representative of whether or not Vread is greater than the reference voltage Vref. As discussed below, this is representative of the state of the poly-fuse-resistor 104. For example, the reference-voltage Vref may have a voltage very similar to a value centered between [Vrs−Iread*Ri] and [Vrs−Iread*Amin*Ri] such that the read-out-signal Dout has a logical value of 1 when the poly-fuse-resistor 104 is in the altered-resistance-state and a logical value of 0 when the poly-fuse-resistor 104 is in the initial-resistance state. Alternatively, the reference-voltage Vref may be approximately mid-way between the value of Vread when the poly-fuse-resistor is in the initial-resistance-state and the value of Vread when the poly-fuse-resistor 104 is in the altered-resistance state. In this way, the probed voltage at the comparator-input-terminal 146 will be distinctly greater or less than the reference-voltage Vref present at the comparator-reference-terminal 148, depending on the state of the poly-fuse-resistor 104.

The act of comparing Vread at the comparator-input-terminal 146 with Vref at the comparator-reference-terminal 148 to provide a read-out-signal Dout, representative of the state of the poly-fuse-resistor 104, is denoted as performing a read-out of the 1 memory bit (of information) of the memory cell 102. If the detected resistance of the poly-fuse-resistor 104 is below a certain threshold value, the read-out value of the read-out-signal Dout at the read-out-terminal 150 is a logical value 0 (memory bit is un-programmed/not written). If the detected resistance of the poly-fuse-resistor 104 is above a certain threshold value, the read-out value is a logical value 1 (memory bit is programmed/written). The sense circuit 142 and read circuitry of the memory cell 102 can operate in such a way that the poly-fuse-resistor 104 is not heated to a temperature that is present during the write-mode described previously.

In some embodiments, the voltage-comparator 144 comprises NPN (or PNP) BJT devices, including a differential pair of bipolar transistors. For instance, the voltage-comparator 144 may comprise a differential pair of bipolar transistors. An example target maximum value of the comparator offset voltage standard deviation is in the order of 1 mV. When using NMOS or PMOS transistors in the comparator input stage, instead of NPN (or PNP) BJTs, the MOS devices need to be much larger in area than the bipolar devices for a similar low offset voltage to provide an operational supply current that is required during the read-out of the memory cell 102.

When the read-mode of the memory system 100 is enabled, the sense circuit 142 can combine with the read circuitry of the memory cell 102 to provide a read-out-signal Dout at the read-out-terminal 150 with a logical value representative of the state of the poly-fuse-resistor 104, which represents the logical value of the memory bit of the memory cell 102.

The sense circuit 142 in this example includes the current source 156 connected between the sense-current-terminal 154 and the sense-ground-terminal 152. In this case, the sense-current-terminal 154 can be connected to the cell-current-terminal 136 to provide the current source functionality to the read circuitry of the memory cell 102. The sense-ground-terminal 152 may also be connected to the ground-terminal 114 of the memory cell 102.

The voltage-comparator 144 is powered by a comparator-supply-voltage and this may be derived from, or be equal to, the system-supply-voltage VIO as shown in FIG. 1, or may be provided by a separate voltage source.

In one or more embodiments there may be multiple sense circuits (i.e. multiple comparators and the same multiple of current sources) operating in parallel fashion. This allows parallel read-out operation of multiple bit/memory cells 102 of the same number as there are sense circuits 142. Such multiple number of bit/memory cells 102 comprises a memory byte or memory word. This is indicated in FIG. 1, which can include an example of 8 comparators and 8 current sources (indicated by the script <7:0>). In such a case, each of the comparator-input-terminals 146 is connected to each of the cell-probe-terminals 140 of each of the multiple of memory cells 102. Similarly each of the current sources 156 may be connected to each of the cell-current-terminals 136 of each of the multiple of memory cells 102. The number of sense circuits 142 and memory cells 102 may be 8, thereby forming an 8 bit memory byte or word. Alternatively, the number of sense circuits 142 and memory cells 102 may be 12, thereby forming a 12 bit memory byte or word, for example.

Further, in one or more embodiments, each of the multiple sense-circuits 142 may be connected to a plurality of memory cells similar to the memory cell 102 of FIG. 1. In such a case, each of the multiple comparator-input-terminals 146 is connected to the cell-probe-terminal 140 of each of the plurality of memory cells. Similarly each of the multiple of current sources 156 may be connected to the cell-current-terminal 136 of each of the plurality of memory cells. The plurality of memory cells may be 4 memory cells for example, or more if needed. The number could potentially be limited by a required speed of operation.

In the embodiment of FIG. 1, the memory system 100 also comprises a common-reference-cell 158 to provide the reference-voltage Vref (Vcomp_plus_ref in FIG. 1) to the comparator-reference-terminal 148 of the voltage-comparator 144 of the sense circuit 142. The common-reference-cell 158 provides the reference-voltage Vref at a reference-voltage-terminal 160. The reference-voltage Vref is provided in response to the read-input-signal (read_n) which is received at a second-read-input-terminal 162. This read-input-signal (read_n) is asserted at the same time as any of the plurality of read-input-signal (read_bit_n) received at the read-input-terminal 134 of the memory-cell 102 is asserted. The reference-voltage Vref is derived from a plurality of reference-poly-fuse-resistors 164, connected in series and each nominally identical to the poly-fuse-resistor 104 of the memory cell 102. Each of the plurality of reference-poly-fuse-resistors 164 are in the initial-resistance-state. That is, they have not been written or exposed to a current of similar magnitude to the write-current, or exposed to a temperature similar to that which exists during the write process.

A reference-read-current is steered through the plurality (an integer number Nref) of reference-poly-fuse-resistors 164. The reference-read-current is similar to the read-current (Iread). Each of the plurality of reference-poly-fuse-resistors 164 can be of the same type, dimension and layout as the poly-fuse-resistor 104 of the memory cell 102. This can reduce/minimise the effects of poly-fuse-resistor manufacturing process variation because it can be approximately equal for all poly-fuse-resistors on a given manufacturing wafer.

The voltage-comparator 144 discriminates the resistance value of an un-programmed poly-fuse-resistor 104 (with nominal value Ri) and the resistance value of a programmed poly-fuse-resistor 104 (with a minimum value Amin*Ri). Nref may be chosen such that Ri<Nref*Ri<Amin*Ri. Therefore, the voltage dropped across the plurality of reference-poly-fuse-resistors 164 is between (i) the voltage dropped across the poly-fuse-resistor 104 in the initial-resistance-state (un-programmed), and (ii) the voltage dropped across the poly-fuse-resistor 104 in the altered-resistance-state (programmed). Nref may further be chosen such that Nref-1 is equal to Amin−Nref. In this case, the difference between the voltage dropped across the poly-fuse-resistor 104 in the initial-resistance state and the voltage dropped across the plurality of reference-poly-fuse-resistors 164, is about equal to the difference between the minimum voltage dropped across the poly-fuse-resistor 104 in the altered-resistance-state (when the resistance is equal to Amin*Ri) and the voltage dropped across the plurality of reference-poly-fuse-resistors 164. This means that the detection window of the voltage-comparator 144 is increased/maximised and centred around Vref.

However, even with this increased comparator window, the value of the window voltage can be of the order of about 10 mV. As a consequence, the voltage-comparator 144 should have a sufficiently small offset voltage (systematic, random and over temperature and any other operation parameters). A practical target maximum value of the standard deviation of the comparator offset voltage is in the order of 1 mV. It can therefore be advantageous to use NPN (or PNP) BJT devices in the voltage-comparator 144 to reduce the area required for the voltage-comparator 144 on an IC, whilst meeting these requirements.

The reference-read-current is driven through the plurality of reference-poly-fuse-resistors 164 by way of a second-current-source 166. In the embodiment of FIG. 1, the second-current-source is provided by a second BJT. The second-current-source 166 is connected, via switching means, to the plurality of reference-poly-fuse-resistors 164 and to a reference-cell-ground-terminal 170. The reference-cell-ground-terminal 170 is in turn connected to the sense-ground-terminal 152 of the sense circuit 142. In this embodiment, the switching means is provided by a reference-n-channel-transistor 176. A third inverter 172 is connected to the control terminal of the reference-n-channel-transistor 176. The conduction channel of the reference-n-channel-transistor 176 is connected in series between the plurality of reference-poly-fuse-resistors 164 and the second-current-source 166. During the read-mode, the read-input-signal (read_n) has a logic 0, which is provided to the second-read-input-terminal 162 via the read-input-signal (read_n). As a result, the reference-n-channel transistor 176 is closed, thereby coupling the second-current-source 166 to the plurality of reference-poly-fuse-resistors 164. As a further result, the reference-read-current flows through the plurality of reference-poly-fuse-resistors 164.

In this embodiment, the same bias voltage 178 is provided to: the second-current-source 166; and the current-source 156 of the sense circuit 142. In embodiments including multiple sense circuits 142, the same bias voltage 178 can be provided to: the second-current-source 166; and each current-source 156 of the multiple sense circuits 142. In this way, a multiple output current mirror is formed and substantially the same current flows through each poly-fuse resistor 104 coupled to the common-reference-cell 158, and the plurality of reference-poly-fuse-resistors 164.

In this example, the common-reference-cell 158 also includes a reference-supply-terminal 180 connected to the supply-voltage-terminal 112 of the memory cell 102. The common-reference-cell 158 may provide a voltage to the supply-voltage-terminal 112 via the reference-supply-terminal 180. The common-reference-cell 158 may provide the read-supply-voltage Vrs to the supply-voltage-terminal 112 via the reference-supply-terminal 180. In the embodiment of FIG. 1, the read-supply-voltage Vrs is derived from the system-supply-voltage VIO and selectively provided to the reference-supply-terminal 180 in response to the read-input-signal (read_n) received at the second-read-input-terminal 162. The second-read-input-terminal 162 is connected to the control terminal of a reference-supply-transistor 182. The conduction channel of the reference-supply-transistor 182 is connected in series with an optional reference-supply-resistor 184 between the system-supply-voltage VIO and the plurality of reference-poly-fuse-resistors 164. The reference-supply-terminal 180 is connected to the node between the reference-supply-resistor 184 and the plurality of reference-poly-fuse-resistors 164. A voltage is dropped across the reference-supply-resistor 184, when the read-out-mode is enabled, such that the voltage at the reference-supply-terminal 180 is the read-supply-voltage. In this example, the reference-supply-resistor 184 has a resistance of 1.3 kilo-ohms.

When the read-mode is enabled, the read-current (Iread) flows through the poly-fuse-resistor 104 and the reference-read-current flows through the plurality of reference-poly-fuse-resistors 64. Similar currents therefore flow through both the poly-fuse-resistor 104 and the plurality of reference-poly-fuse-resistors 164. Both the poly-fuse-resistor 104 and the plurality of reference-poly-fuse-resistors 164 are also connected at one end to the read-supply voltage Vrs. The other end of the poly-fuse-resistor 104 is coupled to the comparator-input-terminal 146 via the cell-probe-terminal 140. The other end of the plurality of reference-poly-fuse-resistors 164 is coupled to the comparator-reference-terminal 148 via the reference-voltage-terminal 160. The reference-voltage Vref provided at the reference-voltage-terminal 160 is therefore representative of the voltage dropped across the plurality of reference-poly-fuse-resistors 164. The voltage-comparator 144 therefore performs a read-out of the memory cell 102 by comparing: (i) Vread, received at the comparator-input-terminal and representative of the voltage dropped across the poly-fuse-resistor 104; to (ii) Vref, received at the comparator-reference-terminal and representative of the voltage dropped across the plurality of reference-poly-fuse-resistors 164. The read-out-terminal 150 provides a read-out-signal Dout representative of the state of the poly-fuse-resistor 104.

The plurality of reference-poly-fuse-resistors 164 is connected to the reference-voltage-terminal 160 via the conduction channel of a reference-p-channel transistor 186. The reference-p-channel-transistor 186 is provided to replicate the small voltage drop experienced across the read-p-channel-transistor 128. In this way, Vread and Vref are offset by the same nominal voltage from the voltage at the lower end of the poly-fuse-resistor 104 and the voltage at the lower end of the plurality of reference-poly-fuse-resistors 164 respectively. The control terminal of the reference-p-channel-transistor 186 is connected to a fourth inverter 174. The fourth inverter 174 is in turn connected to the third inverter 172. In this way, the reference-p-channel-transistor 186 selectively connects the reference-voltage-terminal 160 to the plurality of reference-poly-fuse-resistors during the read-mode, when a logic 0 is received at the second-read-input-terminal 162.

In some embodiments, the common-reference-cell 158 may be connected to multiple sense-circuits, nominally identical to the sense-circuit 142 of FIG. 1. In turn, each of the multiple sense circuits may be connected to a plurality of memory cells nominally identical to the memory cell 102 of FIG. 1. The common-reference-cell 158 can comprise multiple reference-p-channel-transistors 186, one for each of the of sense circuits connected to the common reference cell 158. It will be appreciated that the connections described above between the common-reference-cell 158 and the sense-circuit 142 will exist between the common-reference-cell 158 and each of the multiple sense-circuits. In a similar way, the connections described above between the sense circuit 142 and the memory cell 102 will exist between each of the plurality of sense cells and the multiple memory cells associated with a given sense cell. In a similar way, the connections described above between the common-reference-cell 158 and the memory cell 102 will exist between the common-reference-cell 158 and each of the plurality of memory cells connected to each of the multiple sense circuits.

It is clear to a person skilled in the art to arrange a plurality of such 1 bit memory cells (to construct a matrix of cells) to support a memory size larger than 1 bit. The plurality of cells can be organized by choosing a convenient format of a number of words, where each word comprises of a certain number of bits, such that the number of words multiplied by the number of bits per word equals the specific plurality of cells intended, called the logical memory size. Where possible, support circuits for write and read-out operation that are common to all cells or are common to words can be only instantiated once. In this way, the physical size (chip area) of the complete memory system 100 can be kept to a minimum.

For example, a 32 bit memory system can comprise a system of 8 sense circuits each connected to a separate set of 4 memory cells. To complete the system a common-reference-cell 158 is connected to each of the sense circuits and each of the memory cells. In this way, a memory of 4 words, with 8 bits per word is provided.

Various forms of NVM exist and the examples disclosed herein are applicable to NVM making use of poly-fuse-resistor elements on a BICMOS platform. The poly-fuse-resistor and the BJT can be located as part of the same integrated circuit (IC), where they can be positioned closely together to reduce/minimise the wiring between the poly-fuse resistor 104 and the collector of the BJT 106. In this way, the poly-fuse-resistor and the BJT can be located on a common die/substrate. One or more of the examples disclosed herein can make NVM possible in a given BICMOS process for a relatively low amount of silicon area. The BICMOS process can be a standard process, with no special masks for poly-fuse-resistors, or no masks for other NVM methods like gate fuse, or floating gate type of NVM. Independent of the memory logical size it can be advantageous to reduce the silicon area (physical size) of the memory. This can also reduce product cost. Also, and especially for memory logical size much larger than 1 bit, reducing the silicon area can help to reduce time constants and thus can help to increase the speed of operation for both writing and reading operations.

Examples disclosed herein can reduce/minimise the silicon area of the complete OTP memory, by using high performance bipolar NPN transistors in a BICMOS process, as compared to being restricted to MOS devices only.

In pure CMOS processes, suitable bipolar transistors are not available in an IC process that would be used for OTP memory applications. If bipolar transistors are present then they may have low hFE, and their use may be restricted to bandgap reference-like circuits. Therefore, a skilled person would not consider implementing OTP using a purely CMOS process.

In a pure bipolar IC process, the circuits tend to be mainly analogue. Therefore, advantages of the digital functionality of CMOS is missing, which can prohibit construction of small OTP control circuits. Therefore, a skilled person would not consider implementing OTP using a purely bipolar process.

It is not obvious to the skilled person to implement circuits disclosed herein using known BICMOS processes. This is due to the feature size of the IC process. The feature size can determine the minimum width of the poly-fuse resistor, and hence the minimum energy needed to program/write the fuse. For examples disclosed herein, the process can have a 0.25 um feature size. In which case, if CMOS transistors were used for fuse writing and for sense reading, they may require a large amount of silicon area to provide adequate performance. Thus, there is an advantage to using a bipolar transistor to conduct the writing-current, as discussed above. With other BICMOS processes, with a larger feature size, the CMOS can be too big to provide an area-efficient OTP controller for some applications. Other examples can relate to a BICMOS platform that has a feature size between 0.15 um and 0.5 um of CMOS channel length, or less than 0.5 um, or less than 0.3 um, or less than 0.25 um, as non-limiting examples.

The instructions can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. A memory system comprising:
a memory cell comprising:
a poly-fuse-resistor,
a bipolar junction transistor having a collector-emitter channel and a base-terminal, wherein the collector-emitter channel of the bipolar junction transistor is connected in series with the poly-fuse resistor between a supply-voltage-terminal and a ground-terminal; and the base-terminal of the bipolar junction transistor is configured to receive a transistor-control-signal to selectively control a current flow through the poly-fuse-resistor, and
a NOR logic gate having p-channel transistors configured to provide the transistor-control-signal.

2. The memory system of claim 1, wherein the bipolar junction transistor is configured to selectively control a writing-current flow through the poly-fuse-resistor, and the writing-current is large enough to change a state of the poly-fuse-resistor from an initial-resistance-state to an altered-resistance-state.

3. The memory system of claim 1, wherein the poly-fuse-resistor and the bipolar junction transistor are provided as part of an identical integrated circuit.

4. The memory system of claim 1, wherein the poly-fuse-resistor and the bipolar junction transistor are provided on an identical substrate.

5. The memory system of claim 1, further comprising:
a sense circuit comprising:
a voltage-comparator with a comparator-input-terminal,
a comparator-reference-terminal, and
a read-out-terminal, wherein the comparator-input-terminal is coupled to a cell-node of the memory cell, such that a voltage at said cell-node is indicative of a voltage dropped across the poly-fuse-resistor, the comparator-reference-terminal is connectable to a reference voltage, and the read-out-terminal is configured to provide a read-out-signal in response to a difference between a voltage at the comparator-input-terminal and a voltage at the comparator-reference-terminal such that said read-out-signal is representative of a resistance-state of the poly-fuse resistor.

6. The memory system of claim 5, wherein the voltage-comparator comprises a differential pair of bipolar transistors.

7. The memory system of claim 5, wherein the voltage-comparator, the poly-fuse-resistor, and the bipolar junction transistor are provided on an identical substrate.

8. The memory system of claim 5, wherein the memory system further comprises:
a common-reference-cell comprising:
a reference-supply-terminal connected to the supply-voltage-terminal of the memory cell,
a reference-cell-ground-terminal connected to the ground-terminal of the memory cell,
a plurality of reference-poly-fuse-resistors connected in series with each other between the reference-supply-terminal and the reference-cell-ground-terminal, and
a reference-voltage-terminal connected to the comparator-reference-terminal of the voltage-comparator and configured to provide a voltage representative of the voltage dropped across the plurality of reference-poly-fuse-resistors.

9. The memory system of claim 1, wherein the logic gate comprises:
a first transistor, having a conduction-channel and a control-terminal;
an input-terminal connected to the control-terminal of the first transistor;
a limiting-resistor; and
an output-terminal configured to provide the transistor-control-signal, wherein the conduction-channel of the first transistor and the limiting-resistor are connected in series between a logic-gate-supply-terminal and the output-terminal.

10. The memory system of claim 1, further comprising:
read circuitry, wherein the read circuitry comprises:
a cell-current-terminal that is connectable to a current source, and configured to conduct a read current during a read-mode,
a cell-probe-terminal configured to provide a signal that is indicative of a voltage dropped across the poly-fuse-resistor,
a first-read-switch connected between: (i) the poly-fuse-resistor, and (ii) the cell-probe-terminal, and configured to selectively connect the poly-fuse-resistor to the cell-probe-terminal in accordance with a read-input-signal, and
a second-read-switch connected between: (i) the poly-fuse-resistor, and (ii) the cell-current-terminal, and configured to selectively connect the poly-fuse-resistor to the cell-current-terminal in accordance with a read-input-signal.

11. The memory system of claim 1, wherein the memory system is implemented on a BICMOS platform.

12. The memory system of claim 11, wherein the BICMOS platform has a feature size that is less than 0.5 um.

13. An integrated circuit comprising the memory system of claim 1.

* * * * *